United States Patent
Akram (10) Patent No.: US 6,919,220 B2
(45) Date of Patent: Jul. 19, 2005

(54) METHOD OF MAKING CHIP PACKAGE WITH GREASE HEAT SINK

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/033,233

(22) Filed: Dec. 28, 2001

(65) Prior Publication Data

US 2002/0052105 A1 May 2, 2002

Related U.S. Application Data

(62) Division of application No. 09/387,640, filed on Aug. 31, 1999, now Pat. No. 6,424,033.

(51) Int. Cl.⁷ .......................... H01L 21/44; H01L 21/48; H01L 21/50
(52) U.S. Cl. ....................... 438/106; 438/107; 438/112; 257/685; 257/686; 257/687; 257/718
(58) Field of Search ................................. 438/106, 107, 438/108, 112, 124, 126, 127, 122; 257/685, 686, 687, 712, 714, 718, 720, 796

(56) References Cited

U.S. PATENT DOCUMENTS

| | | | | |
|---|---|---|---|---|
| 4,887,148 A | * | 12/1989 | Mu ............................. 257/664 |
| 5,475,040 A | | 12/1995 | Jamison et al. ............. 536/513 |
| 5,583,378 A | | 12/1996 | Marrs et al. ................. 257/710 |
| 5,633,535 A | | 5/1997 | Chao et al. |
| 5,729,050 A | * | 3/1998 | Kim ............................ 257/667 |
| 5,767,447 A | * | 6/1998 | Dudderar et al. .......... 174/52.4 |
| 5,780,928 A | * | 7/1998 | Rostoker et al. ............. 257/713 |
| 5,786,631 A | | 7/1998 | Fishley et al. ............... 257/701 |
| 5,834,337 A | | 11/1998 | Unger et al. ................. 438/122 |
| 5,843,810 A | | 12/1998 | Sato et al. ................... 438/123 |
| 5,891,755 A | | 4/1999 | Edwards et al. ............ 438/108 |
| 5,907,189 A | | 5/1999 | Mertol ........................ 257/787 |
| 5,910,010 A | | 6/1999 | Nishizawa et al. ........... 438/15 |
| 5,930,893 A | | 8/1999 | Eaton ....................... 28/890.03 |
| 6,011,304 A | * | 1/2000 | Mertol ........................ 257/706 |
| 6,175,157 B1 | | 1/2001 | Morifuji ..................... 257/777 |
| 6,215,180 B1 | | 4/2001 | Chen et al. ................. 257/720 |
| 6,218,202 B1 | * | 4/2001 | Yew et al. .................... 438/15 |
| 6,352,879 B1 | * | 3/2002 | Fukui et al. ................ 438/106 |
| 6,359,335 B1 | * | 3/2002 | Distefano et al. ........... 257/707 |
| 6,376,908 B1 | * | 4/2002 | Gaku et al. ................. 257/707 |
| 6,410,988 B1 | * | 6/2002 | Caletka et al. ............. 257/778 |

FOREIGN PATENT DOCUMENTS

JP 362023138 A 1/1987

OTHER PUBLICATIONS

R Hundadi et al., High Thermal Conductivity Greases, pp 28–32, (Advanced Packaging, Apr. 1999).*
R. Hundadi, et al., High Thermal Conductivity Greases,: pp. 28–32, Advanced Packaging, Apr. 1999).*
R. Hundadi, et al., High Thermal Conductivity Greases,: pp. 28–32, Advanced Packaging, Apr. 1999).*
R. Hundadi, et al., High Thermal Conductivity Greases,: pp. 28–32, Advanced Packaging, Apr. 1999.

* cited by examiner

Primary Examiner—W. David Coleman
Assistant Examiner—Khiem D Nguyen
(74) Attorney, Agent, or Firm—TraskBritt, PC (57) ABSTRACT

The present invention relates to enhanced protection of the active surface and the bond wires or ball array of a microelectronic device, and to thermal management of the microelectronic device as it is packaged with a printed circuit board (PCB) or other substrate. The enhanced protection and thermal management are accomplished with a high-temperature thermal grease that is glob topped or encapsulated over the bond wires or ball array, and the active surface of the microelectronic device. The high-temperature thermal grease exchanges heat, particularly by conduction, away from the active surface of the microelectronic device as well as away from the bond wires.

10 Claims, 4 Drawing Sheets

METHOD OF MAKING CHIP PACKAGE WITH GREASE HEAT SINK

RELATED APPLICATIONS

This application is a divisional of U.S. patent application Ser. No. 09/387,640, filed on Aug. 31, 1999, now U.S. Pat. No. 6,424,033 B1, issued Jul. 23, 2002 which is incorporated herein by reference.

BACKGROUND OF THE INVENTION

1. The Field of the Invention

The present invention relates to the packaging of microelectronic devices. More particularly, the present invention relates to heat management for packaged microelectronic devices. Specifically, the present invention relates to the placement of a thermal grease heat transfer medium within an integrated circuit (IC) chip package for heat transfer away from the microchip. The grease acts as a heat sink to assist in the management of heat that is generated by an IC chip in the IC chip package.

2. The Relevant Technology

Miniaturization is the process of crowding an increasing number of microelectronic circuits onto a single chip. Additionally, miniaturization involves the reduction of the overall chip package size so as to achieve smaller and more compact devices such as hand-held computers, personal data assistants (PDA), portable telecommunication devices, and the like. Ideally, the chip package size would be no larger than the chip itself. Miniaturization has the counterproductive effect upon chip packaging of an increased heat load upon a smaller chip package. Heat management is, therefore, an important aspect of producing a reliable microelectronic device. A heat sink for a chip package allows for enhanced performance of the microelectronics.

In the packaging of microelectronic devices, protection of the microelectronic device and its connections to the outside world is critical during packaging and field use. A prior art solution to packaging of microelectronic devices was to cover the integrated circuit chip with a plastic or ceramic material after a manner that both the highly sensitive active surface of the chip as well as the electrical connections were protected. Plastic packaging such as an epoxy material is useful to protect the active surface as well as the electrical connections. Plastic packaging has the disadvantage of being a poor conductor of heat compared to ceramic packaging. Where a plastic material is used, its effect as a poor heat conductor often leads to additional measures that must be taken to extract generated heat from the chip package to allow proper functioning of the microelectronic device. Ceramic packaging has an advantage of a higher thermal conductivity compared to plastic, but it is often costly and bulky, as well as potentially brittle. Where the chip package receives a physical blow, the ceramic package may shatter.

What is needed in the art is a means of transferring heat away from a microelectronic device that overcomes the heat management problems of the prior art.

SUMMARY OF THE INVENTION

The present invention relates to an integrated circuit chip package having an IC chip with an active surface, where the active surface has extending therefrom an electrical connector in electrical communication with the IC chip. The IC chip is mounted upon a substrate such as a printed circuit board (PCB). A grease is in contact with the active surface of the IC chip and a container is disposed upon the substrate. The grease is enclosed within the container and the substrate.

The present invention relates to the use of the grease as a protective substance to protect both the active surface of the IC chip and simultaneously as a heat transfer medium to transfer heat away from the IC chip. The present invention also relates to a method of heat transfer away from an IC chip using grease, a substrate upon which the IC chip is mounted, and a container.

In one embodiment of the present invention, an IC chip is configured as a board-on-chip (BOC) package and a thermal grease is disposed upon the exposed active surface of the chip, as well as over the electrical connectors such as bond wires or solder balls if present. A protective shell covers the thermal grease to prevent disturbance of the grease during both assembly thereof and during field use. Alternatively, a dam structure may be disposed upon the board and the protective shell to hold the protective shell in place. Additionally, at least one vent hole may be disposed in the protective shell to allow for thermal expansion and contraction of the grease. The BOC configuration lends itself to a stacked BOC package where multiple occurrences of BOC may be enclosed within a single protective shell.

In another embodiment of the present invention, a chip-on-board (COB) chip package is configured with the grease disposed upon the active surface of the IC chip where the grease also covers the bond wires. The protective shell is disposed upon the grease and is secured against the substrate on the same surface onto which the IC chip is disposed. In a variation of this embodiment, the protective shell is configured to make direct contact with the active surface of the IC chip.

Another embodiment of the present invention includes an IC chip mounted directly upon a heat sink. A substrate is also mounted directly upon the heat sink, and grease covers both the active surface of the IC chip and the bond wires. Additionally, a protective shell is mounted upon the substrate, where the grease is enclosed by the protective shell and the substrate.

Another embodiment of the present invention comprises a flip-chip configuration wherein the grease is disposed both upon the active surface of the flip-chip and upon the balls of a flip-chip ball array that provides electrical connections to the flip-chip. A dam structure may be disposed upon both the flip-chip substrate and the flip-chip itself to assist in containing the grease. In a variation of the foregoing involving a flip-chip upon a flexible substrate, a protective shell is disposed upon the flex substrate and grease substantially encompasses the entire flip-chip as well as the flip-chip ball array. In a still further variation, the protective shell is in direct contact with the inactive surface of the flip-chip, the protective shell thereby simultaneously acts as a die attach and heat sink, and the flex substrate with the protective shell provide an enclosure for the grease.

Another embodiment of the present invention includes flip-chip-on-die (FCOD) wherein the flip-chip is disposed against a COB die. In a first configuration of this embodiment, the flip-chip ball array is in contact with a grease and the bond wires from the die are enclosed in a second protective material that is typically a thermoplastic or thermoset resin.

An alternative embodiment of the FCOD configuration provides for grease to be in contact with both the flip-chip ball array and the bond wires from the die. A protective shell is disposed upon the substrate supporting the die such that the protective shell and the substrate enclose therein both the flip-chip and the die.

Another alternative embodiment of the FCOD configuration provides for a two-piece protective shell that may allow the inactive surface of the flip-chip to be exposed. This alternative embodiment provides for the flip-chip ball array and the bond wire to be encompassed by grease while allowing the inactive surface to radiate heat away from the flip chip.

These and other features of the present invention will become more fully apparent from the following description and appended claims or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not, therefore, to be considered to be limiting of its scope, the invention will be described and explained with additional specificity and detail through the use of the accompanying drawings in which.

DETAILED DESCRIPTION OF THE PREFERRED EMBODIMENTS

The present invention relates to an IC chip package that overcomes the problems of the prior art. The IC chip package has a heat sink that comprises a grease that aids heat dissipation and that protects the active surface of the IC chip and/or the electrical connectors such as bond wires or solder balls.

The present invention may include a fine pitch ball array, typically disposed upon a printed circuit board (PCB). The PCB is typically attached to an IC chip. Disposed upon the active surface of the IC chip is the grease. Simultaneously, the grease may also be in direct contact with the electrical connectors such as bond wires or balls in a ball array. A protective shell is placed over the grease.

Reference will now be made to figures wherein like structures will be provided with like reference designations. It is to be understood that the drawings are diagrammatic and schematic representations of embodiments of the present invention and are not limiting of the present invention nor are they necessarily drawn to scale.

Figure 1:
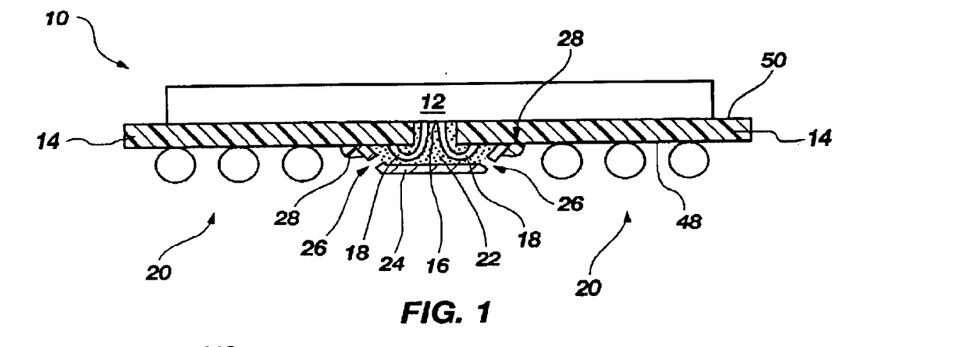
FIG. 1 is an elevational cross-section view of a board-on-chip package according to the present invention.

FIG. 1 is an elevational cross-section view of an IC chip package 10 with a board-on-chip (BOC) configuration. FIG. 1 illustrates an IC chip 12 disposed upon a substrate 14 such as a flexible PCB. The active surface 16 of IC chip 12 is disposed against a first side 50 of substrate 14. Emerging from the active surface 16 of IC chip 12, are bond wires 18 that act as electrical connectors between active surface 16 of IC chip 12 and substrate 14.

For chip package 10, in the BOC configuration, a ball array 20 is disposed upon a second side 48 of substrate 14. Second side 48 is opposite and parallel with first side 50 upon which IC chip 12 is disposed.

A grease 22 is disposed upon active surface 16 of IC chip 12 as well as in direct contact with bond wires 18. Grease 22 thus provides a heat sink having a first thermal conductivity that is in direct contact with both active surface 16 and bond wires 18. Preferably, a protective shell 24 is disposed over grease 22 in order to prevent the disturbance and/or flow of grease 22 during ordinary handling incidental to the assembly of chip package 10 and incidental to ordinary field use. The protective shell 24 is preferably composed of a thin metal or other highly thermally conductive material that allows for good thermal coupling to thermal grease 22. In some cases, such a protective shell may not be necessary.

Grease 22 may be any high thermal conductivity grease known in the art. Preferably, grease 22 is a high thermal conductivity grease that will flow at a minimum temperature that is in a range from about 190° C. to about 230° C., and preferably will flow at no less than a temperature of about 220° C. An example of preferred high thermal conductivity greases is GELEASE™ manufactured by Thermoset Plastics, Inc. of Indianapolis, Ind. A preferred class of protective materials is described in "High Thermal Conductivity Greases" by Ron Hunadi and Rich Wells (advanced packaging, Apr. 19, 1999, pp. 28–31), the disclosure of which is incorporated herein by specific reference.

The present invention contemplates a dielectric grease that has a thermal conductivity in a range from about 0.5 Watts/m·K to about 5 Watts/m·K, preferably from about 2 Watts/m·K to about 4 Watts/m·K. Additionally, the grease will preferably have a dielectric constant that is in a range from about 1.2 to about 10, preferably from about 4 to about 9.5, and most preferably less than about 6. Because of high temperature operation of chip packages, the dielectric grease will preferably have a melting point that is in a range from about 100° C. to about 230° C., and preferably from about 190° C. to about 220° C. Another property that is preferred for the grease 22 is a minimum weight loss at chip package operating temperatures for the conceivable lifetime of the chip package. Preferably, the grease has a weight loss at a sustained temperature of 100° C. over a period of 30 days of less than about 0.15%. It is preferred that, under these conditions, the grease 22 will have a weight loss over a period of about 20 years of less than about 0.25%.

Vent holes 26 may be provided in protective shell 24 in order to allow the expansion of grease 22 under high temperature cycling conditions. Vent hole 26 may be a single vent hole or a plurality of vent holes. Vent hole 26 allows for the expansion of an excess amount of grease 22 during such high temperature applications as burn-in testing. The size of vent hole 26 may be such so as to allow for excess grease 22 to exude from within the enclosure formed by protective shell 24 and substrate 14. Multiple vent holes can also be employed.

A dam structure 28 may be placed in contact with protective shell 24 and second side 48 of substrate 14 to hold protective shell 24 in place. Where the stickiness and viscosity of grease 22 is sufficient to hold protective shell 24 in place, dam structure 28 may be omitted. Alternatively, protective shell 24 can be directly attached to substrate 14 by use of suitable adhesives.

Protective shell 24 is preferably made of a metallic or ceramic material that has a thermal conductivity that is greater than the thermal conductivity of grease 22. Thereby, protective shell 24 acts as a second heat sink that facilitates the transfer of heat through grease 22 away from IC chip 12. Preferred metals for protective shell 24 include Al, Cu, Au or alloys of such metal, and Ag. Most preferably, protective shell 24 is composed of Cu or an alloy thereof.

Figure 2:
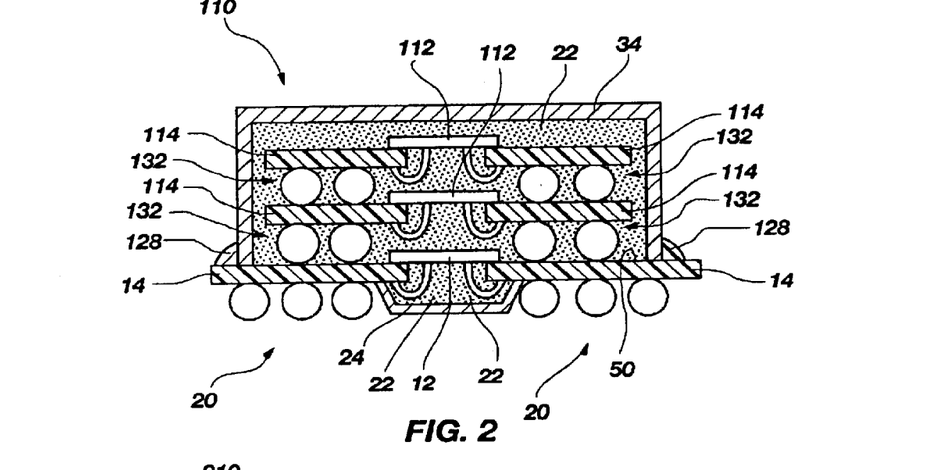
FIG. 2 is an elevational cross-section view of a stacked board-on-chip configuration according to the present invention.

The BOC configuration lends itself well to multiple BOC packages that use grease 22 as a heat transfer medium and as a protective substance. FIG. 2 illustrates a multiple BOC chip package 110 wherein substrate 14 has its own IC chip 12 and ball array 20 along with protective shell 24 that contains grease 22. Over first side 50 of substrate 14 is disposed a substrate 114 and an enclosed ball array 132. Substrate 114 supports an IC chip 112 to comprise a second BOC configuration that is stacked upon substrate 14. FIG. 2 also illustrates a third BOC configuration such that three BOC configurations comprise chip package 110.

A second protective shell 34 encloses the major portion of chip package 110. Disposed in the interstices of chip package 110 is grease 22. Alternatively, a dam structure 128 may also be provided upon first side 50 of substrate 14 and against second protective shell 34 in order to hold second protective shell 34 against substrate 14. Although not pictured, one or multiple vent holes may be provided as illustrated in FIG. 1. The vent holes may be provided both for protective shell 24 and for protective shell 34.

Figure 3:
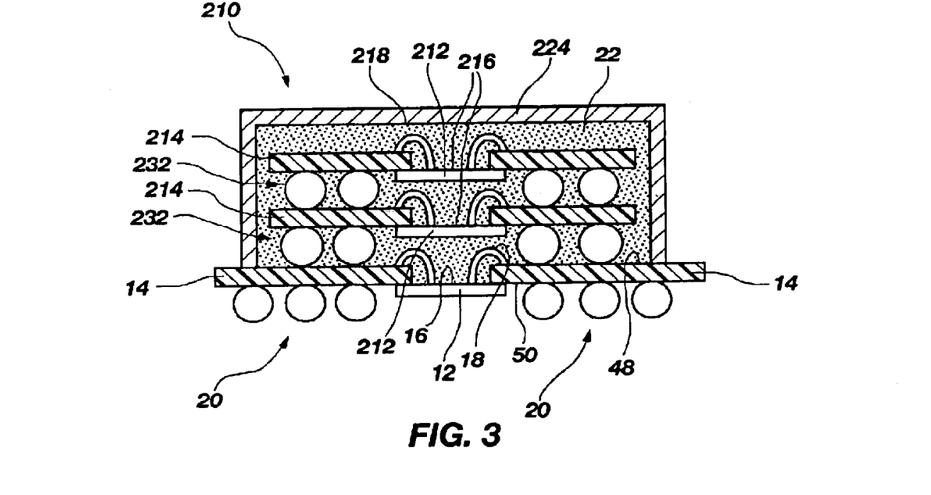
FIG. 3 is an elevational cross-section view of a stacked board-on-chip configuration, wherein the board and chip orientation is vertically inverted in comparison to the configuration depicted in FIG. 2.

Another alternative embodiment of multiple, stacked BOC configurations is illustrated in FIG. 3 as a chip package 210. The configuration of each BOC substructure is vertically inverted in comparison to the configuration of each BOC substructure depicted in FIG. 2. The embodiment depicted in FIG. 3 includes substrate 14 and IC chip 12 disposed upon first side 50 of substrate 14. In this embodiment, ball array 20 is also disposed upon first side 50. FIG. 3 depicts that each active surface 16, and 216 of IC chips 12 and 212, and all bond wires 18 and 218, as well as substrates 214 and connective elements 232, are enclosed in a single space formed principally by protective shell 224 and substrate 14. Thereby, two protective shells are not required and chip package 210 is enclosed substantially in a common space with all active surfaces and electrical connectors being in contact with grease 22 contained therein. A vent hole (not pictured) may also be present.

One of the advantages in relation to heat management that exists in the present invention is the rapid flow of generated heat through grease 22 due to its higher coefficients of thermal conductivity compared to thermoplastics and thermoset resins of the prior art. A particular advantage in the stacked BOC configurations depicted in FIGS. 2 and 3 is that a chip in the stack that generates more heat than others will be cooled by the presence of other chips, particularly through the conductive heat transfer medium provided by grease 22.

The presence of grease 22 in every embodiment of the present invention has an advantage over plastics in that the preferred grease has a greater thermal conductivity than the plastics. The flowability of grease permits direct contact with active surfaces of IC chips and electrical connectors, whereas ceramic housings do not permit this type of intimate contact with hot surfaces. Likewise, with the intimate contact there is a continuum of thermal conductivity between the hot surface, the grease, the substrate, and the protective shell.

Figure 4:
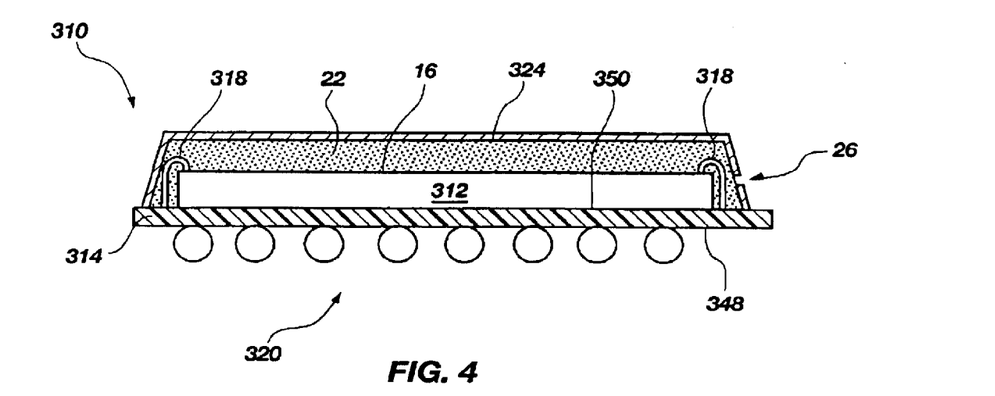
FIG. 4 is an elevational cross-section view of a chip-on-board configuration according to the present invention.

In a chip-on-board (COB) configuration of the present invention, FIG. 4 illustrates a chip package 310 that includes an IC chip 312 disposed upon a substrate 314. IC chip 312 has its active surface 16 and bond wires 318 on a first side 350 of substrate 314. Opposite and parallel to first side 350, a ball array 320 is disposed upon a second side 348 of substrate 314. Grease 22 is enclosed by a combination of a protective shell 324, first side 350 of substrate 314, and portions of IC chip 312. FIG. 4 also illustrates the positioning of an optional vent hole 26 through the wall of protective shell 324.

Figure 5:
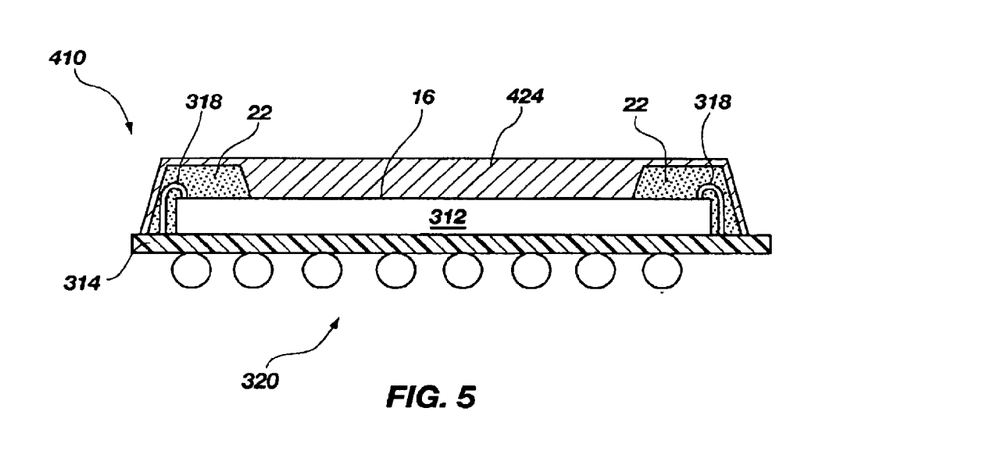
FIG. 5 is an elevational cross-section view of an alternative embodiment of the chip-on-board configuration depicted in FIG. 4 wherein the protective shell acts as a direct-contact heat sink to the active surface of the chip.

FIG. 5 illustrates an alternative to the embodiment of chip package 310 depicted in FIG. 4. A chip package 410 illustrated in FIG. 5 depicts a section of a protective shell 424 that makes contact with upper surface 16 of IC chip 312. In this configuration, direct contact of protective shell 424 with upper surface 16 comprises a die-attach heat sink. Where the thermal conductivity of protective shell 424 is greater than the thermal conductivity of grease 22 and where direct contact by protective shell 424 is made onto IC chip 312, heat transfer away from IC chip 312 is facilitated to a greater degree than the embodiment depicted in FIG. 4. It is noted that protective shell 424 can also be attached to chip 312 at active surface 16 through a conductive adhesive or an epoxy such as those used for die-attach applications and are known in the art.

Figure 6:
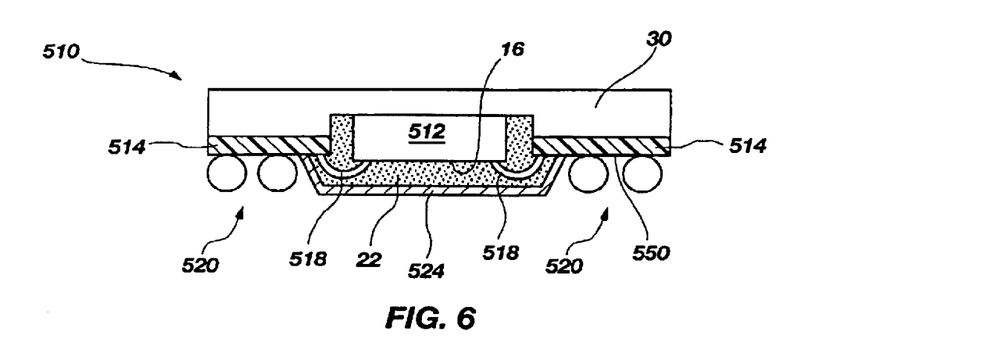
FIG. 6 is an elevational cross-section view of a chip-on-heat-sink configuration according to the present invention.

FIG. 6 is another embodiment of the present invention, wherein a chip package 510 is depicted that includes an IC chip 512 disposed against a heat sink 30. A substrate 514 bearing ball array 520 is disposed upon heat sink 30 and active surface 16 is in electrical connection with a first side 550 of substrate 514 through bond wires 518. According to the present invention, grease 22 is in contact with active surface 16 of IC chip 512 and with bond wires 518. Further, grease 22 is enclosed by a protective shell 524 that also is disposed upon substrate 514. According to this embodiment of the present invention, chip package 510 allows for a significant amount of heat transfer into heat sink 30, while also allowing a significant amount of heat transfer from active surface 16 and bond wires 518 into grease 22. As in all other embodiments set forth in the present invention, a vent hole is optional. Further, a dam structure is also optional.

Figure 7:
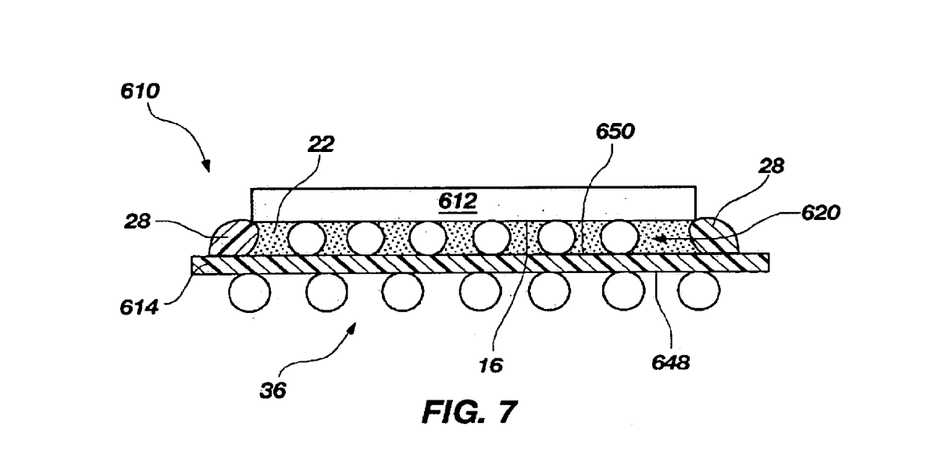
FIG. 7 is an elevational cross-section view of a flip-chip-on-flex configuration according to the present invention.

FIG. 7 illustrates another embodiment of the present invention wherein a chip package 610 comprises flip-chip-on-flex (FCOF) technology. A flip-chip 612 has a ball array 620 disposed upon active surface 16 thereof. Ball array 620 is disposed upon a substrate 614 that is typically a flexible PCB. Non-flexible substrates can also be employed. Grease 22 is disposed both against active surface 16 and in contact with each individual ball of ball array 620. Typically, dam structure 28 is an epoxy material or glob top material. Grease 22 is, therefore, containerized by the combination of active surface 16 of flip-chip 612, dam structure 28 that acts as a container, and the first surface 650 of substrate 614. As is typical with FCOF, a second ball array 36 is disposed upon the second side 648 of substrate 614. It is notable that FIG. 7 discloses no vent hole to allow for the expansion and contraction of grease 22. A vent hole, however, may be formed by placing a hole in substrate 614 at a location that opens up to first side 650 without any obstruction from an electrical connection disposed upon first side 650.

Figure 8:
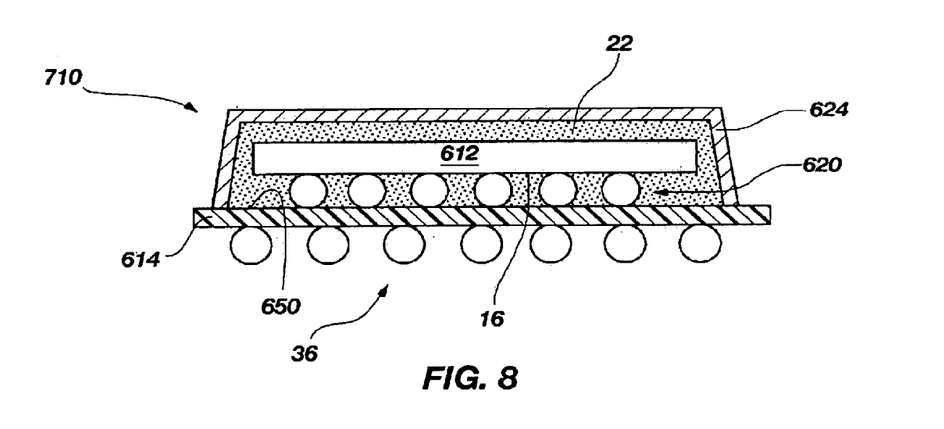
FIG. 8 is an elevational cross-section view of an alternative embodiment of a flip-chip-on-flex configuration according to the present invention.

FIG. 8 is another embodiment of FCOF technology according to the present invention. An FCOF package 710 is depicted as comprising flip-chip 612 with ball array 620 disposed upon active surface 16 thereof. In place of dam structure 28 to act as the container, a protective shell 624 is displayed as being disposed upon substrate 614. Protective shell 624 is used for enclosing grease 22 along with a combination of protective shell 624, and first side 650 of substrate 614. Grease 22 thus substantially contacts all exposed surfaces of flip-chip 612 and also contacts all exposed electrical connectors that comprise ball array 620.

A particular advantage of the embodiment depicted in FIG. 8 is that it allows for a shared heat load by all portions of flip-chip 612 through the medium of grease 22 as a heat transfer material. Where one portion of flip-chip 612 may be more microelectronically active than any other portion, grease 22 will heat in that region and allow for heat to be drawn away therefrom to other portions of flip-chip 612 that are not as active.

Figure 9:
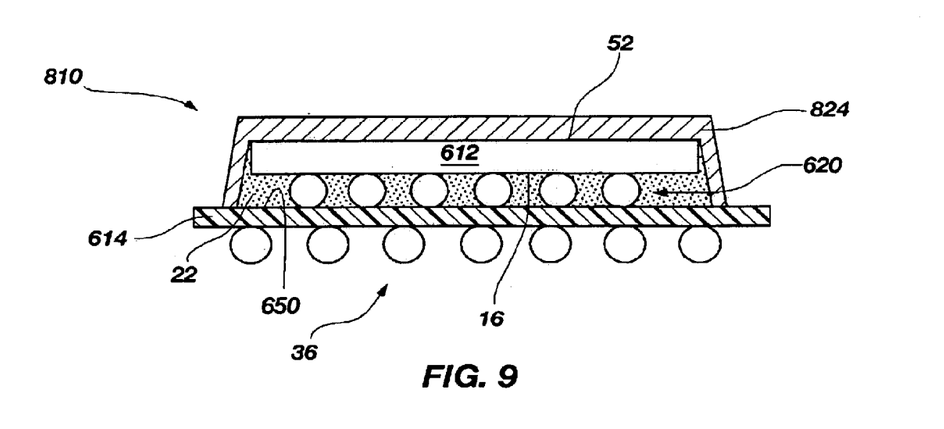
FIG. 9 is an elevational cross-section view of another alternative embodiment of the flip-chip-on-flex configuration.

Another embodiment of the FCOF configuration is depicted in FIG. 9, wherein a chip package 810 includes flip-chip 612 and ball array 620 disposed upon substrate 614 at its first side 650. Additionally, a protective shell 824 is disposed upon substrate 614 but it also makes direct contact with flip-chip 612 at its inactive surface 52. Thus, protective shell 824 acts as a die-attach for flip-chip 612. Simultaneously, protective shell 824 is both a heat sink and a container for holding grease 22 against active surface 16 of flip-chip 612 and against the electrical connectors that make up ball array 620.

Figure 10:
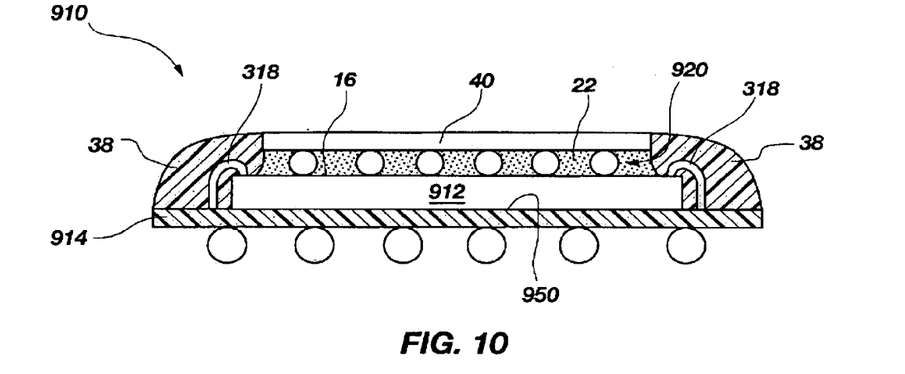
FIG. 10 is an elevational cross-section view of a flip-chip-on-die configuration according to the present invention.

Another application of the present invention is directed toward flip-chip-on-die (FCOD) technology as depicted in FIG. 10. An FCOD package 910 includes an IC chip 912 that acts as the die in the FCOD configuration. IC chip 912, referred to hereafter as die 912, is disposed upon a substrate 914 and also has bond wires 318 that make electrical connection between active surface 16 and first side 950 of substrate 914. A ball array 920 acts as the electrical connector between a flip-chip 40 and die 912. Grease 22 is depicted as filing the interstices between individual balls of ball array 920, between flip-chip 40 and die 912. FIG. 10 also illustrates the presence of a second protective material 38 that is preferably a thermoplastic or thermoset resin. Second protective material 38 acts as both a container that is disposed upon substrate 914 and as a protective cover for bond wires 318.

Figure 11:
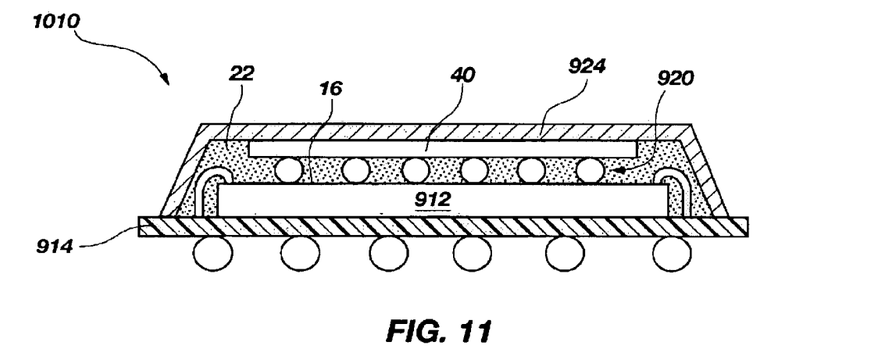
FIG. 11 is an elevational cross-section view of an alternative embodiment of the flip-chip-on-die-configuration.

FIG. 11 is another embodiment of an FCOD configuration, wherein a chip package 1010 includes die 912 with a ball array 920 disposed upon active surface 16 of die 912. A flip-chip 40 is disposed upon ball array 920. A protective shell 924 is disposed upon substrate 914. Contained within protective shell 924 and substrate 914 is grease 22. FIG. 11 illustrates direct contact of protective shell 924 against flip-chip 40. Accordingly, protective shell 924 acts as a conductive heat sink for flip-chip 40. Where die 912 produces a major portion of heat during ordinary use of chip package 1010, flip-chip 40 itself acts as a heat sink for die 912 in addition to protective shell 924 as protective shell 924 makes direct contact with flip-chip 40. Grease 22 operates to moderate extreme temperature fluctuation due to its ability to conduct heat more efficiently than the thermoplastic and thermoset materials of the prior art.

Figure 12:
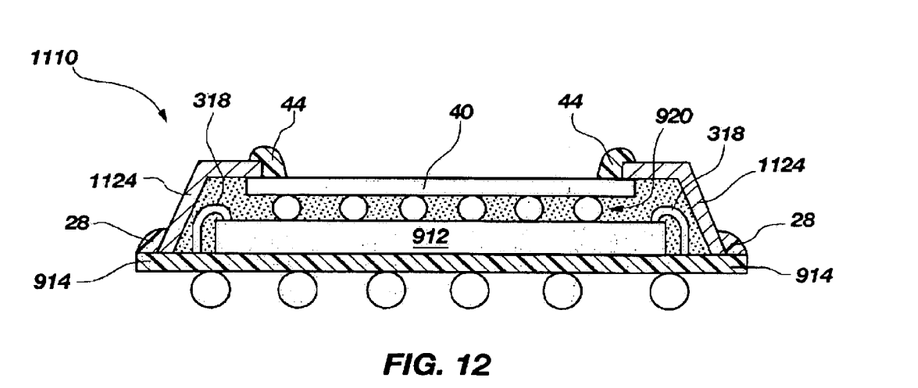
FIG. 12 is an elevational cross-section view of another alternative embodiment of the flip-chip-on-die configuration.

Another embodiment of FCOD technology is depicted in FIG. 12, wherein a chip package 1110 is configured with both die 912 and flip-chip 40 disposed with ball array 920 therebetween. A protective shell 1124 is depicted as being disposed upon substrate 914. Optionally, dam structure 28 assists in securing protective shell 1124 to substrate 914. A second dam structure 44 is also optionally present in order to assist in securing protective shell 1124 to flip-chip 40. In the embodiment depicted in FIG. 12, heat conduction that may occur principally in die 912 is dissipated by the presence of flip-chip 40 as a heat sink therefor.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of making an IC chip package having a first IC chip with an active surface, the active surface having an electrical connector extending therefrom in electrical communication with the first IC chip, the first IC chip being mounted upon a first side of a board-on-chip (BOC) substrate having the first side that is opposite a second side thereof, the method comprising:
   providing a second IC chip having an active surface and being disposed over the first side of the BOC substrate;
   providing a container disposed upon the BOC substrate, the container in contact with the active surface of the first IC chip; and
   injecting a grease between the BOC substrate and the container;
   wherein the grease:
      is in contact with the electrical connector and with the active surfaces of each of the first and second IC chips; and
      is enclosed within the container and the BOC substrate.

2. The method as defined in claim 1, further comprising:
   providing a third IC chip having an active surface and being disposed over the first side of the BOC substrate and over the second IC chip such that the grease is in contact with the active surface of the third IC chip.

3. The method as defined in claim 2, further comprising:
   operating the first, second, and third IC chips to generate heat therefrom; and
   conducting the heat from the electrical connector and from the first, second, and third IC chips to the grease, to the container, and to the ambient.

4. The method as defined in claim 1, wherein the grease has:
   a thermal conductivity in a range from about 2 Watts/m·K to about 5 Watts/m·K;
   a dielectric constant in a range from less than about 6 to about 9; and
   a melting point in a range from about 190° C. to about 220° C.

5. The method as defined in claim 1, further comprising:
   generating heat from at least one of the first and second IC chips by operating the at least one of the IC chips; and
   allowing the heat to propagate to the grease and to the container.

6. The method as defined in claim 1, further comprising:
securing the container to the BOC substrate with a dam structure that contacts the grease.

7. The method as defined in claim 1, further comprising:
operating the first and second IC chips to generate heat therefrom; and
conducting the heat from the IC chips and the electrical connector to the grease, to the container, and to the ambient.

8. The method as defined in claim 1, wherein the grease has a thermal conductivity that is less than a thermal conductivity of the container.

9. The method as defined in claim 1, wherein the IC chip package comprises IC chip elements, wherein the container disposed upon the BOC substrate encloses a volume external to the IC chip elements, and wherein the injecting a grease comprises filling with the grease the volume enclosed by the container.

10. The method as defined in claim 1, wherein the container comprises a metal that has a thermal conductivity greater than the thermal conductivity of the grease.

* * * * *

UNITED STATES PATENT AND TRADEMARK OFFICE
CERTIFICATE OF CORRECTION

| | | |
|---|---|---|
| PATENT NO. | : 6,919,220 B2 | Page 1 of 1 |
| APPLICATION NO. | : 10/033233 | |
| DATED | : July 19, 2005 | |
| INVENTOR(S) | : Akram | |

It is certified that error appears in the above-identified patent and that said Letters Patent is hereby corrected as shown below:

On the Title page, in field (56), under "Other Publications", in column 2, lines 3-8, below "1999)." delete "R. Hundadi, et al., High Thermal Conductivity Greases,: pp. 28-32, Advanced Packaging, Apr. 1999).*
R. Hundadi, et al., High Thermal Conductivity Greases,: pp. 28-32, Advanced Packaging, Apr. 1999).*
R. Hundadi, et al., High Thermal Conductivity Greases,: pp. 28-32, Advanced Packaging, Apr. 1999.".

In column 8, line 64, in Claim 5, delete "and" and insert -- or --, therefor.

Signed and Sealed this

Twenty-fifth Day of November, 2008

JON W. DUDAS
*Director of the United States Patent and Trademark Office*